(12) United States Patent
Saggio et al.

(10) Patent No.: US 12,550,397 B2
(45) Date of Patent: Feb. 10, 2026

(54) SILICON CARBIDE VERTICAL CONDUCTION MOSFET DEVICE AND MANUFACTURING PROCESS THEREOF

(71) Applicant: STMicroelectronics S.r.l., Agrate Brianza (IT)

(72) Inventors: Mario Giuseppe Saggio, Aci Bonaccorsi (IT); Edoardo Zanetti, Valverde (IT); Alessia Maria Frazzetto, Sant'Agata li Battiati (IT); Alfio Guarnera, Trecastagni (IT); Cateno Marco Camalleri, Catania (IT); Antonio Giuseppe Grimaldi, S. Giovanni la Punta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 769 days.

(21) Appl. No.: 17/565,165

(22) Filed: Dec. 29, 2021

(65) Prior Publication Data

US 2022/0246729 A1 Aug. 4, 2022

(30) Foreign Application Priority Data

Jan. 29, 2021 (IT) .................. 102021000001934

(51) Int. Cl.
*H10D 62/832* (2025.01)
*H01L 21/04* (2006.01)
(Continued)

(52) U.S. Cl.
CPC ..... *H10D 62/8325* (2025.01); *H01L 21/0465* (2013.01); *H01L 21/265* (2013.01); *H10D 62/378* (2025.01); *H10D 62/393* (2025.01)

(58) Field of Classification Search
CPC ............ H10D 62/8325; H10D 62/378; H10D 62/393; H10D 12/031; H10D 30/66;
(Continued)

(56) References Cited

U.S. PATENT DOCUMENTS 5,341,011 A 8/1994 Hshieh et al.
11,522,053 B2 * 12/2022 Toner .................... H10D 30/65
(Continued)

FOREIGN PATENT DOCUMENTS

CN 203983267 U 12/2014
CN 106298517 A 1/2017
(Continued)

*Primary Examiner* — Su C Kim
(74) *Attorney, Agent, or Firm* — Seed Intellectual Property Law LLP (57) ABSTRACT

A vertical conduction MOSFET device includes a body of silicon carbide, which has a first type of conductivity and a face. A superficial body region of a second type of conductivity has a first doping level and extends into the body to a first depth, and has a first width. A source region of the first type of conductivity extends into the superficial body region to a second depth, and has a second width. The second depth is smaller than the first depth and the second width is smaller than the first width. A deep body region of the second type of conductivity has a second doping level and extends into the body, at a distance from the face of the body and in direct electrical contact with the superficial body region, and the second doping level is higher than the first doping level.

20 Claims, 7 Drawing Sheets

(51) Int. Cl.
  *H01L 21/265* (2006.01)
  *H10D 62/17* (2025.01)

(58) Field of Classification Search
  CPC ............... H10D 62/127; H10D 64/256; H01L 21/0465; H01L 21/265; H01L 21/046
  See application file for complete search history.

(56) References Cited

U.S. PATENT DOCUMENTS

| | | | |
|---|---|---|---|
| 2005/0151189 A1 | 7/2005 | Brambilla | |
| 2008/0239792 A1 | 10/2008 | Wann et al. | |
| 2009/0218620 A1 | 9/2009 | Hebert et al. | |
| 2009/0218621 A1* | 9/2009 | Pfirsch | H10D 30/66 257/E29.256 |
| 2012/0193643 A1* | 8/2012 | Masuda | H01L 29/7802 257/77 |
| 2016/0056276 A1* | 2/2016 | Zhang | H10D 62/371 257/329 |
| 2016/0141371 A1 | 5/2016 | Tega et al. | |
| 2016/0163817 A1 | 6/2016 | Horii et al. | |
| 2016/0181373 A1 | 6/2016 | Masuda et al. | |
| 2017/0077238 A1 | 3/2017 | Kono et al. | |
| 2017/0077285 A1 | 3/2017 | Uehara et al. | |
| 2017/0125575 A1* | 5/2017 | Ohoka | H10D 84/141 |
| 2017/0323970 A1* | 11/2017 | Dolny | H10D 30/658 |
| 2018/0212048 A1* | 7/2018 | Zhang | H10D 30/022 |
| 2018/0308936 A1 | 10/2018 | Shimizu et al. | |
| 2019/0097037 A1* | 3/2019 | Kiyosawa | H10D 64/252 |
| 2020/0259012 A1* | 8/2020 | Pala | H01L 29/7803 |
| 2020/0388695 A1 | 12/2020 | Sundaresan et al. | |
| 2021/0119008 A1 | 4/2021 | Takahashi et al. | |
| 2022/0246723 A1 | 8/2022 | Saggio et al. | |

FOREIGN PATENT DOCUMENTS

| | | |
|---|---|---|
| CN | 217239469 U | 8/2022 |
| JP | 2006120894 A | 5/2006 |
| JP | 2009277839 A | 11/2009 |
| JP | 2017055011 A | 3/2017 |
| JP | 2018200920 A | 12/2018 |
| KR | 20030070264 A | 8/2003 |
| WO | 2010134344 A1 | 11/2010 |
| WO | 2014207856 A1 | 12/2014 |
| WO | 2016114057 A1 | 7/2016 |
| WO | 2019198167 A1 | 10/2019 |
| WO | WO 2019198168 A1 | 10/2019 |

\* cited by examiner

SILICON CARBIDE VERTICAL CONDUCTION MOSFET DEVICE AND MANUFACTURING PROCESS THEREOF

BACKGROUND

Technical Field

The present disclosure relates to a silicon carbide vertical conduction MOSFET device and the manufacturing process thereof.

Description of the Related Art

As is known, semiconductor materials having a wide forbidden band gap, for example greater than 1.1 eV, low on-state resistance, high thermal conductivity, high operating frequency and high saturation velocity of charge carriers allow to obtain electronic devices, such as diodes and transistors, having better performance with respect to silicon electronic devices, in particular for power applications, for example operating at voltages comprised between 600 V and 1300 V or in specific operating conditions such as high temperature.

In particular, it is known to obtain such electronic devices from a silicon carbide wafer in one of its polytypes, e.g., 3C-SiC, 4H-SiC and 6H-SiC, which are distinguished by the characteristics listed hereinabove.

BRIEF SUMMARY

The present disclosure provides various embodiments which overcome some or all of the drawbacks of the prior art.

According to the present disclosure, a MOSFET device and a manufacturing process thereof are provided.

In at least one embodiment, a vertical conduction MOSFET device is provided that includes a body of silicon carbide having a first type of conductivity and a face. A superficial body region of a second type of conductivity has a first doping level and extends into the body, from the face of the body, to a first depth along a first direction, and has a first width along a second direction transversal to the first direction. A source region of the first type of conductivity extends toward an inside of the superficial body region, from the face of the body, to a second depth, along the first direction, and has a second width along the second direction. The second depth is smaller than the first depth and the second width is smaller than the first width. A deep body region of the second type of conductivity, having a second doping level, extends into the body, at a distance from the face of the body, and is in direct electrical contact with the superficial body region. The second doping level is higher than the first doping level.

In at least one embodiment, a process for manufacturing a vertical conduction MOSFET device is provided that includes: forming, in a silicon carbide work body having a first type of conductivity and a face, a superficial body region of a second type of conductivity, having a first doping level, the superficial body region extending from the face of the work body, to a first depth along a first direction, and having a first width along a second direction transversal to the first direction; forming a source region, of the first type of conductivity, in the superficial body region, the source region extending from the face of the work body, to a second depth, along the first direction, and having a second width along the second direction, wherein the second depth is smaller than the first depth and the second width is smaller than the first width; and forming, in the work body, a deep body region of the second type of conductivity, having a second doping level, at a distance from the face of the body, the deep body region being in direct electrical contact with the superficial body region, wherein the second doping level is higher than the first doping level.

In at least one embodiment, a device is provided that includes a silicon carbide substrate having a first conductivity type and a first surface. A superficial body region of a second conductivity type has a first doping level and extends into the substrate from the first surface to a first depth along a first direction. The superficial body region has a first width along a second direction transverse to the first direction. A source region of the first conductivity type extends into the superficial body region from the first surface to a second depth along the first direction, and the source region has a second width along the second direction. The second depth is less than the first depth and the second width is less than the first width. A deep body region of the second conductivity type has a second doping level that is greater than the first doping level. The deep body region is spaced apart from the first surface by the source region and is in direct contact with the superficial body region.

BRIEF DESCRIPTION OF THE SEVERAL VIEWS OF THE DRAWINGS

For a better understanding of the present disclosure, embodiments thereof are now described, purely by way of non-limiting example, with reference to the attached drawings, wherein.

DETAILED DESCRIPTION

Figure 1:
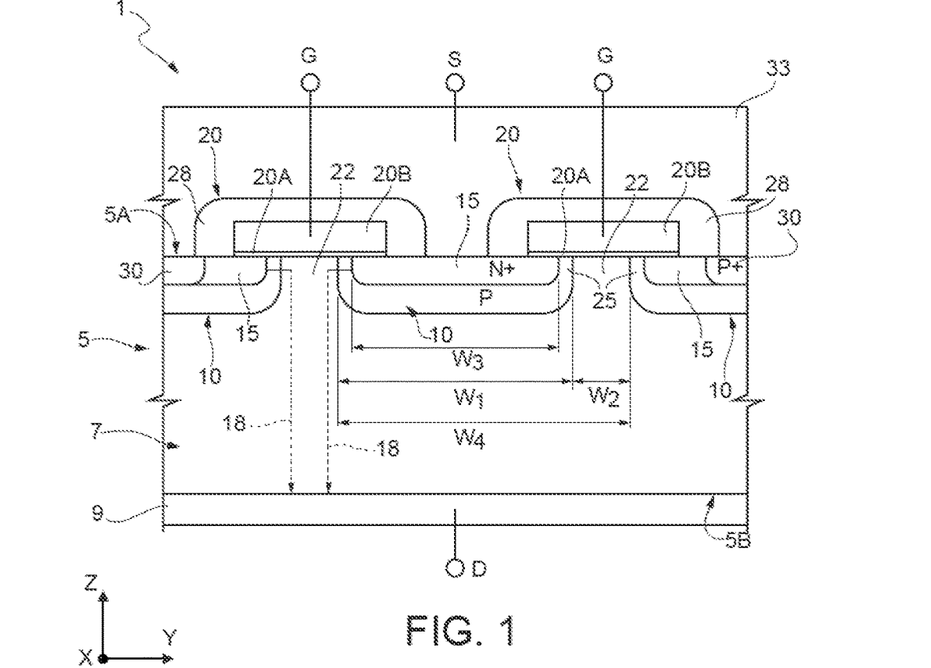
FIG. 1 shows a cross-section of a silicon carbide vertical conduction MOSFET device, in accordance with a comparative example.

For example, FIG. 1 shows a comparative example of a vertical conduction MOSFET device 1 in a Cartesian reference system XYZ comprising a first axis X, a second axis Y and a third axis Z.

The MOSFET device 1 is formed by a plurality of elementary cells, only a few of which shown here, equal to each other and arranged in parallel in a same die, which share a source terminal S and a drain terminal D.

The MOSFET device 1 is formed in a body 5 of silicon carbide having a first surface 5A and a second surface 5B.

The body 5 accommodates a drain region 7, a plurality of body regions 10 and a plurality of source regions 15.

The drain region 7, here of N-type, extends between the first and the second surfaces 5A, 5B of the body 5.

A drain contact region 9, of conductive material for example of metal or silicide, extends on the second surface 5B of the body 5, in direct electrical contact with the drain region 7, and forms the drain terminal D of the MOSFET device 1.

The body regions 10 are of P-type and extend into the body 5 from the first surface 5A. Each body region 10 has a doping level comprised between $1 \cdot 10^{17}$ atoms/cm$^3$ and $1 \cdot 10^{20}$ atoms/cm$^3$, a depth comprised between 0.3 μm and 2 μm, along the third axis Z, and a width $W_1$ along the second axis Y.

A superficial portion 22 of the drain region 7, having width $W_2$ along the second axis Y, projects between two adjacent body regions 10.

The sum of the width $W_1$ and of the width $W_2$ defines the pitch of the MOSFET device 1, which, in current devices, is greater than 4 μm.

The body regions 10 also extend along the first axis X, being, in top view, not shown here, for example strip- or ring-shaped.

The source regions 15 each extend from the first surface 5A of the body 5 inside a respective body region 10 and are of N-type, with a doping level comprised between $1 \cdot 10^{18}$ atoms/cm$^3$ and $1 \cdot 10^{20}$ atoms/cm$^3$. Each source region 15 has a width $W_3$, along the second axis Y, smaller than the width $W_2$ of the respective body region 10 and a depth, along the third axis Z, smaller than the depth of the respective body region 10.

Each source region 15 and each superficial portion 22 of the drain region 7 laterally delimit a channel region 25 in a respective body region 10.

The MOSFET device 1 further comprises a plurality of insulated gate regions 20. The insulated gate regions 20 are each formed by a gate insulating layer 20A, in contact with the first surface 5A of the body 5; by a gate conductive layer 20B, directly overlying the gate insulating layer 20A; and by a passivation layer 28, which covers the gate conductive layer 20B and, together with the gate insulating layer 20A, seals the gate conductive layer 20B. In detail, the gate insulating layer 20A of an insulated gate region 20 extends on a respective superficial portion 22 of the drain region 7, on two channel regions 25 adjacent to the respective superficial portion 22 and partially on two source regions 15 adjacent to the respective channel regions 25.

The gate conductive layers 20B of the insulated gate regions 20 are electrically connected in parallel, in a manner not shown here, forming a gate terminal G of the MOSFET device 1.

The MOSFET device 1 further comprises a plurality of body contact regions 30 and a front metallization region 33.

The body contact regions 30 are of P+-type and each extend, from the first surface 5A of the body 5, inside a respective source region 15, in contact with a respective body region 10. Generally, in current MOSFET devices, every source region 15 accommodates more than one body contact region 30, which are arranged at a mutual distance along the first axis X of FIG. 1. Furthermore, as visible in FIG. 1, the body contact regions 30 of adjacent source regions 15 are arranged staggered, so that, along the second axis Y, no body contact region 30 is visible in the portion of the central source region 15.

The front metallization region 33, for example of metal and/or metal silicide, forms the source terminal S of the MOSFET device 1 and extends on the first surface 5A of the body 5, in direct electrical contact with the source regions 15 and the body contact regions 30.

Each elementary cell of the MOSFET device 1 has a respective switch-on threshold voltage $V_{th}$. In use, if the voltage $V_{GS}$ between the gate terminal G and the source terminal S is higher than the threshold voltage $V_{th}$, the MOSFET device 1 is in an on-state, wherein the respective channel region 25 is conductive and a current may flow between the source terminal S and the drain terminal D, along the conductive path 18 identified for clarity by a dashed arrow in FIG. 1.

In order to obtain a higher current in the on-state, increasing the density of elementary cells obtained in a same die, that is decreasing the pitch $W_4$, is desirable. However, decreasing the pitch $W_4$ entails disadvantages for the MOSFET device 1. For example, the body regions 10 are obtained by implantation of high-energy dopant ions, for example with a maximum energy even up to 500 keV, in order to obtain the desired depth for the body regions 10, for example a maximum depth of 0.7 μm. The implantation of high-energy dopant ions causes defects in the crystal lattice of the body regions 10 and thus also of the channel regions 25. Furthermore, the high implantation energy also causes a high lateral straggling, for example along the second axis Y, of the dopant ions. Thus, this high lateral straggling contributes to making the concentration of the dopant ions less controllable in the channel region 25, which therefore has a high process variability, consequently causing a high variability of the switch-on threshold voltages $V_{th}$ of the elementary cells, and therefore a performance degradation of the MOSFET device 1.

If the voltage $V_{GS}$ is lower than the switch-on threshold voltage $V_{th}$, the MOSFET device 1 is in an off-state and the voltage $V_{th}$, between the source terminal S and the drain terminal D is applied on the PN junctions formed by the body regions 10, for example of P-type, and by the drain region 7, for example of N-type.

If these PN junctions are in reverse bias condition and the voltage $V_{DS}$ is high, for example higher than 100 V, as in power applications, a high electric field develops in the body 5, in particular in the superficial portions 22 of the drain region 7, in proximity to the insulated gate regions 20. This high electric field causes a high leakage current, unwanted, which may flow in the conductive path 18 between the source terminal S and the drain terminal D. Therefore, the MOSFET device 1 conducts current even in the off-state.

Furthermore, in the MOSFET device 1 in off-state, the highest electric field values, even higher than 1 MV/cm, are obtained at the interface between the superficial portions 22 of the drain region 7 and the gate insulating layers 20A of the insulated gate regions 20. This determines a short lifespan of the MOSFET device 1. In fact, high electric field values in proximity to the insulating material which forms the gate insulating layers 20A of the insulated gate regions 20, typically silicon oxide, cause a rapid degradation thereof, resulting in rapid degradation of the performance of the MOSFET device 1, up to failure.

Various embodiments of the present disclosure overcome some or all of the drawbacks of the comparative example of FIG. 1, as will be discussed in further detail herein.

Figure 2:
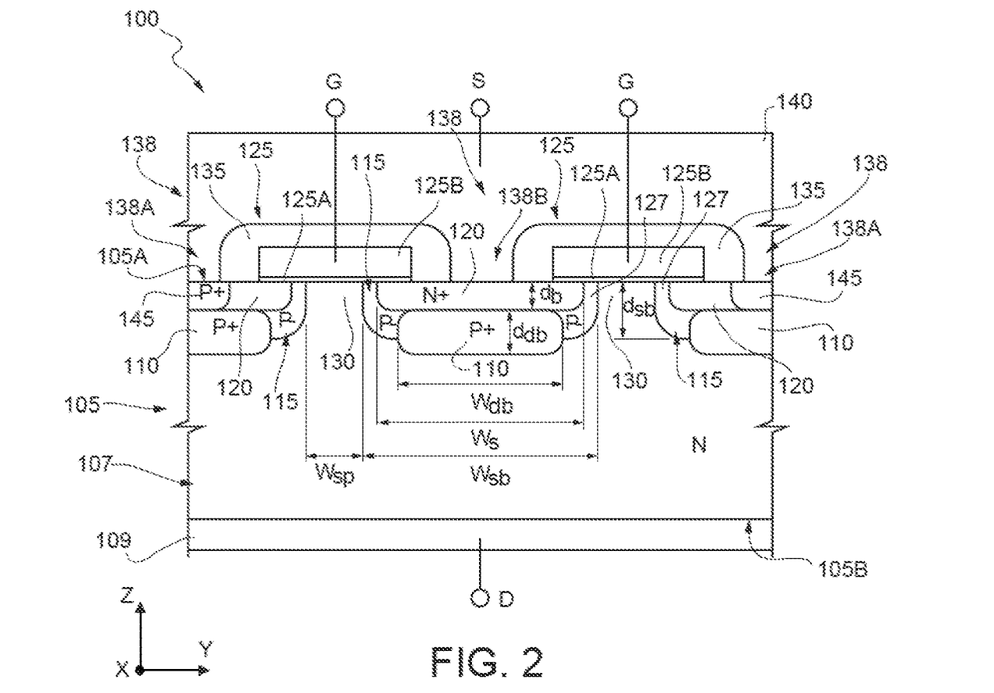
FIG. 2 shows a cross-section of the present silicon carbide vertical conduction MOSFET device, according to an embodiment.
Figure 3:
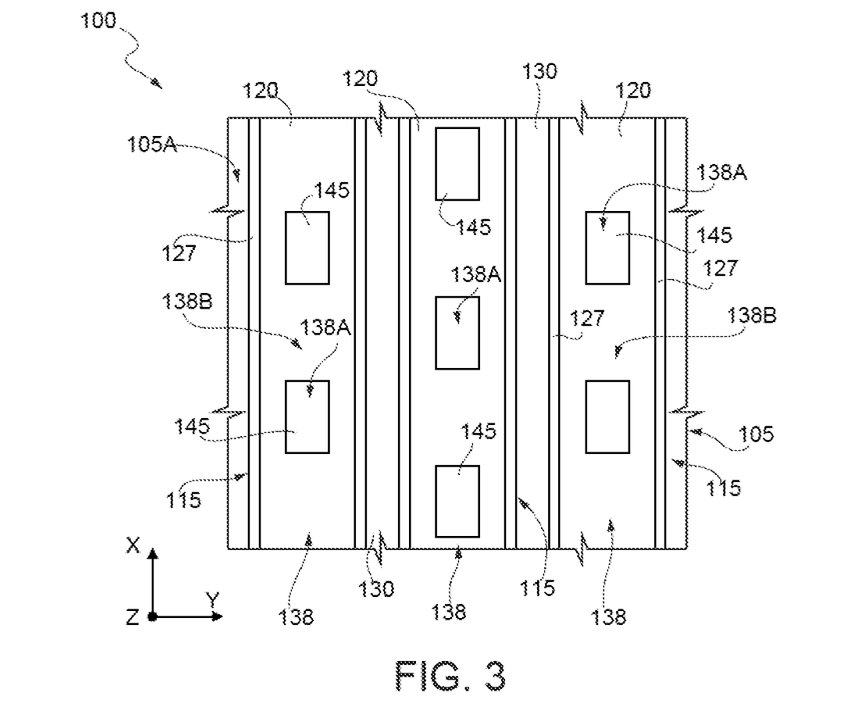
FIG. 3 shows a top plan view of the MOSFET device of FIG. 2.

FIGS. 2 and 3 show a vertical conduction MOSFET device 100 in a Cartesian reference system XYZ having a first axis X, a second axis Y and a third axis Z.

The MOSFET device 100 is formed by a plurality of elementary cells, of which only a few are shown in FIGS. 2 and 3, equal to each other and arranged in a same die to share a drain terminal D, a gate terminal G and a source terminal S; that is, the elementary cells are electrically connected in parallel with each other.

The MOSFET device 100 is formed in a body 105 of semiconductor material having a first surface 105A and a second surface 105B.

The body 105 may be formed by a substrate or by a substrate having one or more epitaxial layers grown thereon and is of silicon carbide, in one of its polytypes, here of the 4H-SiC polytype.

The body 105 accommodates a drain region 7, a plurality of deep body regions 110, a plurality of superficial body regions 115 and a plurality of source regions 120.

The drain region 107, here of N-type, extends between the first and the second surfaces 105A, 105B of the body 105.

A drain contact region 109, of conductive material, for example of metal or silicide, extends on the second surface 105B of the body 105, in direct electrical contact, in particular ohmic, with the drain region 107. The drain contact region 109 forms the drain terminal D of the MOSFET device 100.

The deep body regions 100 are here of P-type and extend into the body 105 at a distance from the first surface 105A of the body 105; in particular from a body depth $d_b$, for example comprised between 0.2 μm and 1 μm. The deep body regions 110 each have a doping level for example comprised between $1·10^{18}$ atoms/cm$^3$ and $1·10^{20}$ atoms/cm$^3$, a depth $d_{db}$ comprised for example between 0.2 μm and 1 μm along the third axis Z so to have a maximum depth in the body 105 comprised for example between 0.4 μm and 2 μm, in particular of 0.7 μm, and a width $W_{db}$ along the second axis Y.

The superficial body regions 115 are here of P-type and extend into the body 105 from the first surface 105A of the body 105, for a greater depth than the body depth $d_b$, in direct electrical contact with a respective deep body region 110.

The superficial body regions 115 each have a lower doping level than the doping level of the deep body regions 110, for example comprised between $5·10^{16}$ atoms/cm$^3$ and $5·10^{17}$ atoms/cm$^3$.

The superficial body regions 115 each have a depth $d_{sb}$, which may be greater or smaller, here smaller, than the depth $d_{db}$ of a respective deep body region 110, and which is comprised for example between 0.3 μm and 1.5 μm, in particular of 0.3 μm, along the third axis Z.

In this embodiment, the depth $d_{sb}$ of the superficial body regions 115 is such that the deep body regions 110 each extend partially inside a respective superficial body region 115.

Furthermore, the superficial body regions 115 each have a width $W_{sb}$ along the second axis Y, which is greater than or equal to, here greater than, the width $W_{db}$ of the respective deep body region 110.

The superficial body regions 115 each comprise a channel portion 127, which extends directly under the first surface 105A of the body 105 and is delimited, along the second axis Y, by a respective superficial portion 130 of the drain region 107 and by a respective source region 120. Each superficial portion 130 has width $W_{sp}$ along the second axis Y and extends between two adjacent superficial body regions 115.

The sum of the width $W_{sp}$ of the superficial portions 130 of the drain region 107 and the width $W_{sb}$ of the superficial body regions 115 defines the pitch of the MOSFET device 100.

The source regions 120 are here of N-type and each extend from the first surface 105A of the body 105 inside a respective superficial body region 115.

In detail, the source regions 120 each have a doping level for example comprised between $1·10^{18}$ atoms/cm$^3$ and $1·10^{20}$ atoms/cm$^3$.

The source regions 120 each have a width $W_s$, along the second axis Y, which is smaller than the width $W_{sb}$ of a respective superficial body region 115.

In this embodiment, the width $W_s$ of each source region 120 is greater than the width $W_{db}$ of a respective deep body region 110.

The source regions 120 extend along the third axis Z each for a depth which is smaller with respect to the depth of the respective superficial body region 115. Here, the source regions 120 each extend to the body depth $d_b$; that is, the source regions 120 are each contiguous with a respective deep body region 110.

As shown in FIG. 3 in the top view of the body 105, the superficial body regions 115, the source regions 120 and the deep body regions 110 (the latter not shown), extend strip-shaped along the first axis X.

However, the deep body regions 110, the superficial body regions 115 and the source regions 120 may have, in top view, different shape, for example may be ring-shaped, or may form rectangles or other polygons separated from each other in the body 105.

The MOSFET device 100 further comprises a plurality of insulated gate regions 125.

Again with reference to FIG. 2, the insulated gate regions 125 extend on the first surface 105A of the body 105 and are each formed by a gate insulating layer 125A, for example of silicon oxide, in contact with the first surface 105A of the body 105; by a gate conductive layer 125B, for example of polysilicon, directly overlying the respective gate insulating layer 125A; and by a passivation layer 135, which covers the respective gate insulating layer 125A and the respective gate conductive layer 125B at the top and at the side.

The gate conductive layers 125B of the insulated gate regions 125 are electrically connected in parallel, in a manner not shown here, forming the gate terminal G of the MOSFET device 100.

The insulated gate regions 125 each extend above a respective superficial portion 130 of the drain region 107, on two adjacent channel portions 127 and partially on two adjacent source regions 120.

In this embodiment, the insulated gate regions 125 extend, along the first axis X, each strip-shaped, and, along the second axis Y, at a mutual distance, to form elongated openings 138, also directed parallel to the first axis X. In particular, the elongated openings 138 comprise first and second contact zones 138A, 138B, which extend alternate and contiguous with each other along the first axis X.

The MOSFET device 100 further comprises a plurality of body contact regions 145 and a front metallization region 140.

The body contact regions 145 are of P-type, each with a doping level for example comprised between $1·10^{19}$ atoms/cm$^3$ and $1·10^{20}$ atoms/cm$^3$, and each extend from the first surface 105A of the body 105, at the first contact zones 138A, inside a respective source region 120, in direct electrical contact with the deep body regions 110.

The front metallization region 140, for example of metal (possibly comprising a metal silicide bottom layer), extends into the elongated openings 138 and on the passivation layers 135 of the insulated gate regions 125. The front metallization region 140 is in direct electrical contact, in particular ohmic, with the source regions 120, at the second contact zones 138B, and with the body contact regions 145, at the first contact zones 138A. The front metallization region 140 thus forms the source terminal S of the MOSFET device 100.

The body contact regions 145 cause the front metallization region 140 to short-circuit the source regions 120 and the deep body regions 110.

The MOSFET device 100 allows a high reliability to be obtained. In fact, since the superficial body regions 115 have a reduced depth, they may be formed through an implantation of dopant ions having a low implantation energy, as described hereinafter in more detail with reference to FIGS. 4A-4D and 5A-5C. Due to the use of a low implantation energy, a reduced lateral straggling of the dopant ions is obtained and therefore a concentration profile of the dopant ions in the body 105 that is controllable and compliant with what established at the design stage.

As a consequence, the switch-on threshold voltage $V_{th}$ of the MOSFET device 100 is subject to a lower process variability.

In addition, the switch-on threshold voltage $V_{th}$ of the MOSFET device 100 is subject to a lower process variability even if the deep body regions 110 are formed by implantation of dopant ions at a higher implantation energy with respect to the superficial body regions 115. In fact, the deep body regions 110 have here a smaller width than the superficial body regions 115, as described hereinabove and visible in FIG. 2. Accordingly, even if the dopant ions of the deep body regions 110 were subject to a greater lateral straggling, the greater lateral straggling would not affect the doping level of the channel portions 127 of the superficial body regions 115 and of the superficial portions 130 of the drain region 107.

As discussed hereinafter with reference to FIGS. 4A-4D and 5A-5C, the fact that the superficial body regions 115 are formed with a lower implantation energy allows the use of thin masks, for which obtaining a higher lateral definition is easier.

The above means that the pitch of the MOSFET device 100 may be designed to be low, for example lower than 4 µm, in particular comprised between 2.5 µm and 4 µm. For example, the width $W_{sp}$ of the superficial portions 130 of the drain region 107 may be reduced without causing an excessive and unwanted approach of two adjacent superficial body regions 115 such to cause a malfunction of the MOSFET device 100.

Reducing the pitch of the MOSFET device 100 implies the possibility of designing a higher density of elementary cells in parallel in a same die and therefore of obtaining a lowering of the on-state resistance of the MOSFET device 100.

Furthermore, a low implantation energy implies a low probability of defect formation in the silicon carbide crystal lattice portions of the body 105 where the channel portions 127 are formed.

Accordingly, the charge carriers in the channel portions 127 have greater mobility, thus ensuring good performance of the MOSFET device 100.

In addition, the presence of the deep body regions 110 causes, when the MOSFET device 100 is in the off-state and the voltage $V_{DS}$ between the source terminal S and the drain terminal D is high, for example even higher than 400 V, the highest electric field values to be obtained deep in the body 105, at a great distance from the first surface 105A of the body 105.

This causes the electric field to assume lower values in the superficial portions 130 of the drain region 107, in particular in proximity to the gate insulating layers 125A. Accordingly, the MOSFET device 100 may have a long lifespan.

Manufacturing steps of the MOSFET device 100, in particular the manufacturing steps with reference to the formation of the deep body regions 110 and of the superficial body regions 115, are described hereinafter.

Figure 4A:
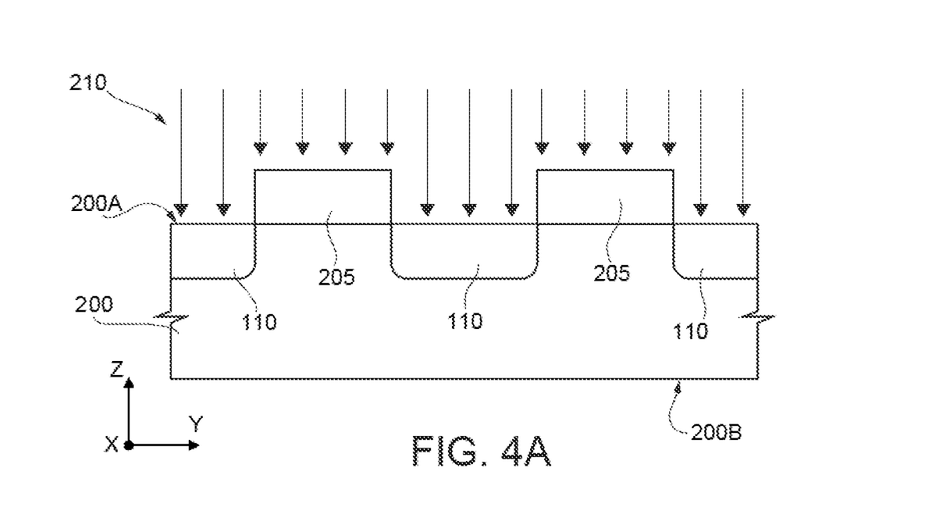
FIGS. 4A-4D show cross-sections of the MOSFET device of FIGS. 2 and 3, in subsequent manufacturing steps, according to an embodiment of the present manufacturing process.

FIG. 4A shows a wafer 200 of silicon carbide, here having an N-type doping and a first and a second surface 200A, 200B. A deep body mask is formed on the first surface 200A of the wafer 200, for example through known lithographic steps. The deep body mask comprises a plurality of deep body mask portions 205, each of a thickness smaller than 1.5 µm, for example comprised between 0.5 µm and 1.5 µm, mutually spaced to expose portions of the wafer 200 where the deep body regions 110 are intended to be formed. By using the deep body mask, a first implantation of P-type dopant ions (here indicated by first arrows 210), for example aluminum or boron ions, having an implantation energy comprised between 30 keV and 200 keV, is performed.

According to an embodiment, the deep body regions 110 are formed through a sequence of subsequent implantations of P-type dopant ions, each having an implantation energy comprised between 30 keV and 200 keV.

According to an embodiment, the wafer 200 is then subject to an annealing step, useful for the activation of the dopant ions and for the reduction of defects in the crystal lattice that may be caused by the implantation.

Subsequently, FIG. 4B, the deep body mask 205 is removed and an epitaxial layer 215 is grown on the first surface 200A of the wafer 200. The first epitaxial layer 215 is delimited by a surface 215A, has the same doping as the wafer 200 and a thickness comprised between 0.3 µm and 1 µm. The wafer 200 and the epitaxial layer 215 form a work wafer 218, corresponding to the body 105, having a first surface corresponding to the surface 215A of the epitaxial layer 215, therefore still indicated by 215A, and a second surface corresponding to the second surface 200B of the wafer 200, therefore still indicated by 200B.

Figure 4B:
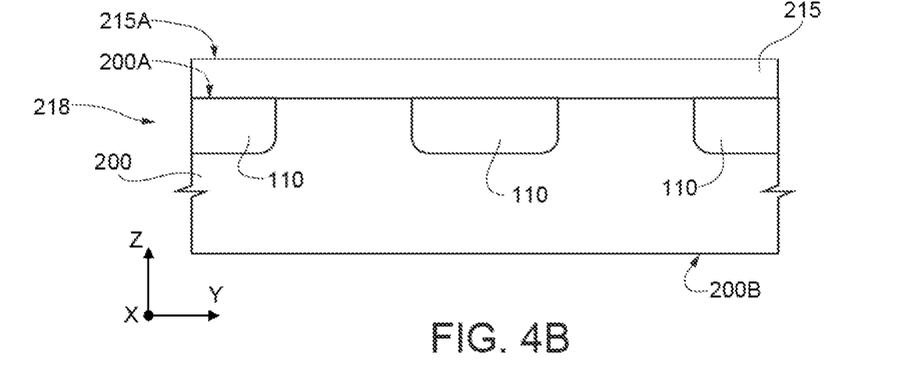
Figure 4C:
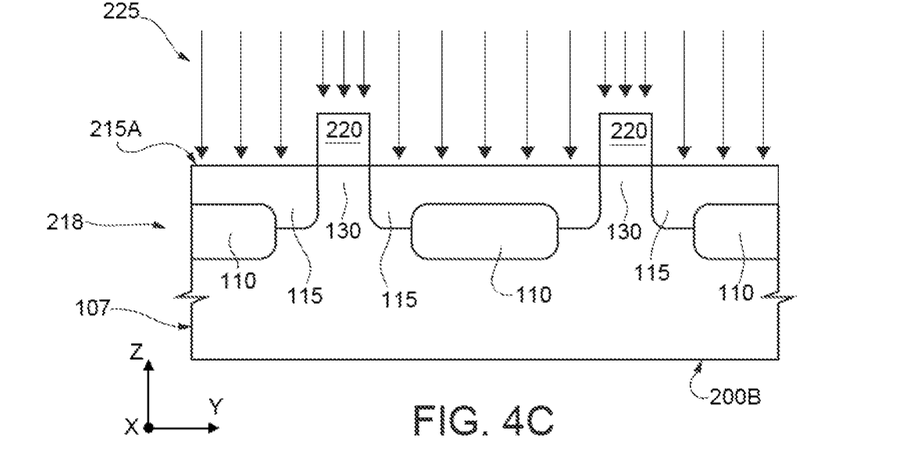

In FIG. 4C, a superficial body mask is formed on the surface 215A of the work wafer 218, for example through known lithographic steps.

The superficial body mask comprises a plurality of superficial body mask portions 220, each having a thickness smaller than 1.5 µm, for example comprised between 0.5 µm and 1.5 µm, mutually spaced to expose portions of the work wafer 218 where the superficial body regions 115 are intended to be formed.

Accordingly, the superficial body mask portions 220 have, along the second axis Y, a smaller width with respect to the width of the deep body mask portions 205.

By using the superficial body mask, a second implantation of P-type dopant ions (here indicated by second arrows 225), for example aluminum or boron ions, having an implantation energy lower than 200 keV, for example comprised between 30 keV and 200 keV, is performed.

The second implantation forms the superficial body regions 115 and delimits the superficial portions 130 of the drain region 107.

According to an embodiment, the superficial body regions 115 are formed through a sequence of subsequent implantations of P-type dopant ions, each having an implantation energy comprised between 30 keV and 200 keV.

According to an embodiment, after the second implantation, the work wafer 218 is subject to an annealing step, useful for the activation of the dopant ions and for the reduction of defects in the crystal lattice that may be caused by the second implantation.

Figure 4D:
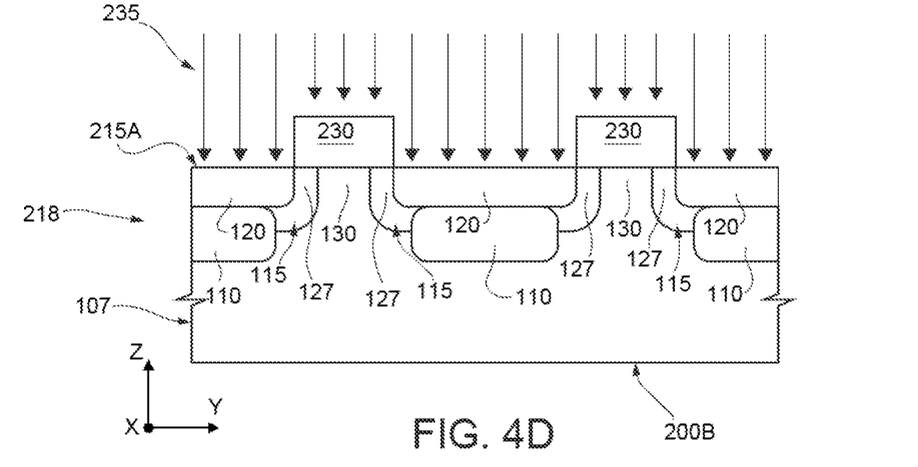

Subsequently, FIG. 4D, a source mask is formed on the first surface 215A of the work wafer 218, for example through known lithographic steps. For example, the source mask may be formed from the superficial body mask 220 of FIG. 4C, so to obtain a good alignment with the preceding manufacturing steps.

The source mask comprises a plurality of source mask portions 230, each with a thickness smaller than 1.5 µm, for example comprised between 0.2 µm and 1.5 µm, and mutually spaced to expose portions of the work wafer 218, where the source regions 120 are intended to be formed. By using the source mask, a third implantation of N-type dopant ions (here indicated by third arrows 235), for example nitrogen or phosphorus ions, having an implantation energy comprised between 20 keV and 200 keV, is performed.

The third implantation forms the source regions 120 and defines the channel portions 127.

According to an embodiment, the source regions 120 are formed through a sequence of subsequent implantations of N-type dopant ions, each having an implantation energy comprised between 20 keV and 200 keV.

According to an embodiment, after the third implantation, the work wafer 218 is subject to an annealing step, useful for the activation of the dopant ions and for the reduction of defects in the crystal lattice that may be caused by the third implantation.

Subsequently, in a manner not shown here but known, the insulated gate regions 125 are formed on the surface 215A of the work wafer 218, and the body contact regions 145, the front metallization region 140 and the drain contact region 109 are formed.

Other manufacturing steps, also known, of the work wafer 218, for example dicing and electrical connection, also follow thus forming the MOSFET device 100.

Therefore, it emerges that, as already discussed hereinabove, the superficial body regions 115 are formed using a low implantation energy. This allows both the lateral straggling of the dopant ions to be reduced and a thin implantation mask, i.e., the superficial body mask 220, to be used. The superficial body mask portions 220 thus have a good lateral resolution, for example along the second axis Y. In this manner, the pitch of the MOSFET device 100 may be designed to be, for example, lower than 4 µm.

Furthermore, the deep body regions 110 are also formed here through a low implantation energy. This allows the lateral straggling of the respective dopant ions to be reduced. Accordingly, the deep body regions 110 may also be formed so that the respective width $W_{db}$ is equal to the width $W_{sb}$ of the superficial body regions 115, without affecting the doping level of the channel portions 127 and of the superficial portions 130 of the drain region 107; thus ensuring good performance of the MOSFET device 100, for the reasons discussed hereinabove.

A different embodiment of the manufacturing process of the MOSFET device 100 of FIGS. 2 and 3 is described hereinafter with reference to FIGS. 5A-5C, wherein parts common to the process of FIGS. 4A-4D have been indicated by the same reference numerals.

Figure 5A:
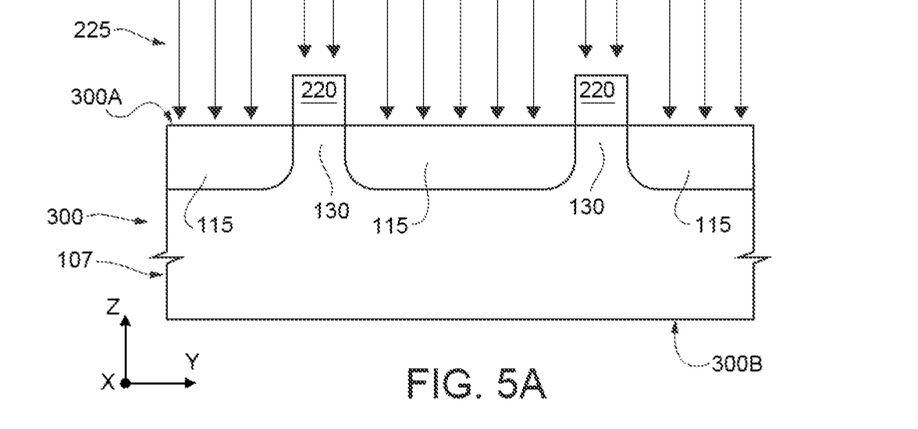
FIGS. 5A-5C show cross-sections of the MOSFET device of FIGS. 2 and 3, in subsequent manufacturing steps, according to a different embodiment of the present manufacturing process.
Figure 5B:
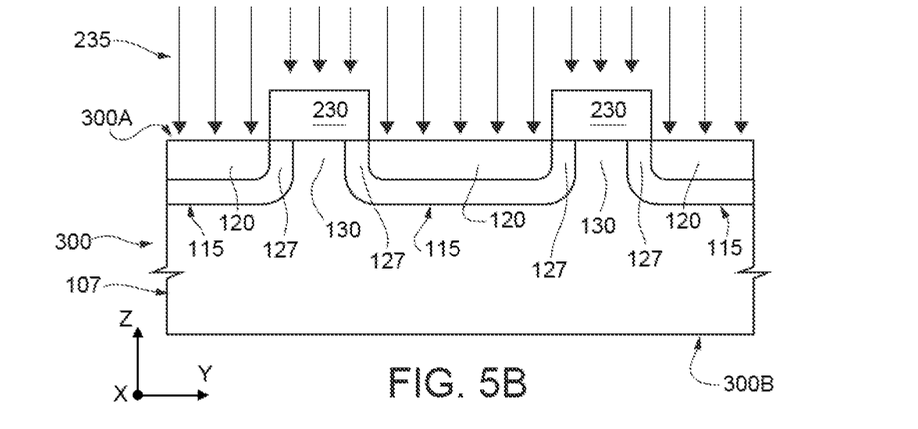

FIG. 5A shows a work wafer 300 of silicon carbide, intended to form the body 105, having a first and a second surface 300A, 300B.

The superficial body mask, comprising the respective superficial body mask portions 220, is formed on the first surface 300A of the work wafer 300 and the superficial body regions 115 are formed through implantation of dopant ions, similarly to what has been discussed with reference to FIG. 4C.

Subsequently, FIG. 5B, the source mask, comprising the respective source mask portions 230, is formed on the first surface 300A of the work wafer 300, and the source regions 120 are formed through implantation of dopant ions, similarly to what has been discussed with reference to FIG. 4D.

Figure 5C:
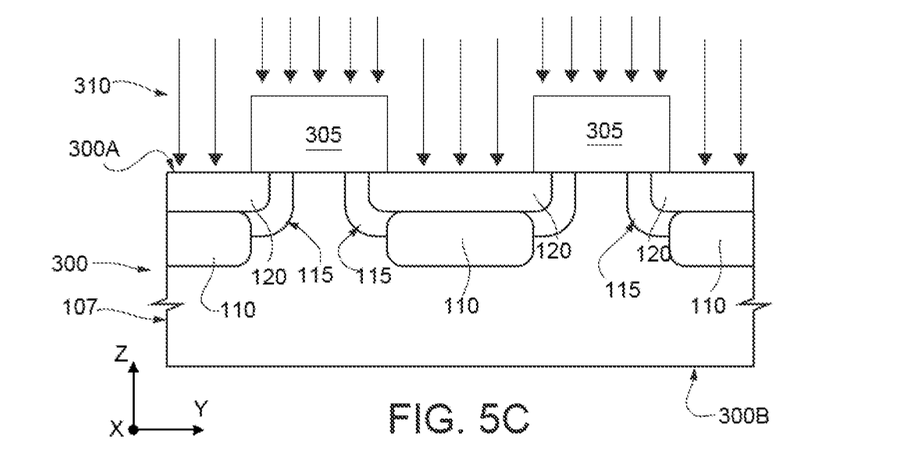

Then, FIG. 5C, the deep body mask, comprising the respective deep body mask portions, here indicated by 305, is formed on the first surface 300A of the work wafer 300, for example through known lithographic steps, and is shaped to expose portions of the work wafer 300 where the deep body regions 110 are intended to be formed.

In this embodiment, the deep body mask portions 305 each have a greater thickness than the deep body mask portions 205 of FIG. 4A, for example comprised between 1.6 µm and 2 µm.

Also here, the deep body mask portions 305 have, along the second axis Y, a greater width than the superficial body mask portions 220.

The deep body regions 110 are formed using the deep body mask, through implantation of P-type dopant ions (here indicated by 310), for example aluminum or boron ions, having an implantation energy comprised between 100 keV and 1 MeV.

According to an embodiment, the deep body regions 110 are formed through a sequence of subsequent implantations of P-type dopant ions, each having an implantation energy comprised between 100 keV and 1 MeV.

According to an embodiment, the deep body mask is removed and the work wafer 300 is subject to an annealing step, useful for the activation of the dopant ions and for the reduction of defects in the crystal lattice that may be caused by the implantation of dopant ions.

After removing the deep body mask, the insulated gate regions 125, the body contact regions 145, the front metallization region 140 and the drain contact region 109 are formed in a known manner.

Other manufacturing steps, also known, of the work wafer 300, for example dicing and electrical connection, also follow thus forming the MOSFET device 100.

Since the width of the deep body mask portions 305 is greater than the width of the superficial body mask portions 220, the deep body mask portions 305 do not contribute to the definition of the pitch of the MOSFET device 100. Accordingly, the definition of the deep body mask portions 305 does not require a high lateral resolution and the fact that the deep body mask portions 305 have a greater thickness than the deep body mask portions 205 of FIG. 4A, does not compromise the advantages of the MOSFET device 100 discussed hereinabove.

Moreover, the greater thickness of the deep body mask portions 305 and the absence of the growth step of the epitaxial layer 215 shown in FIG. 4B, simplify the manufacturing process of the MOSFET device 100.

Figure 6:
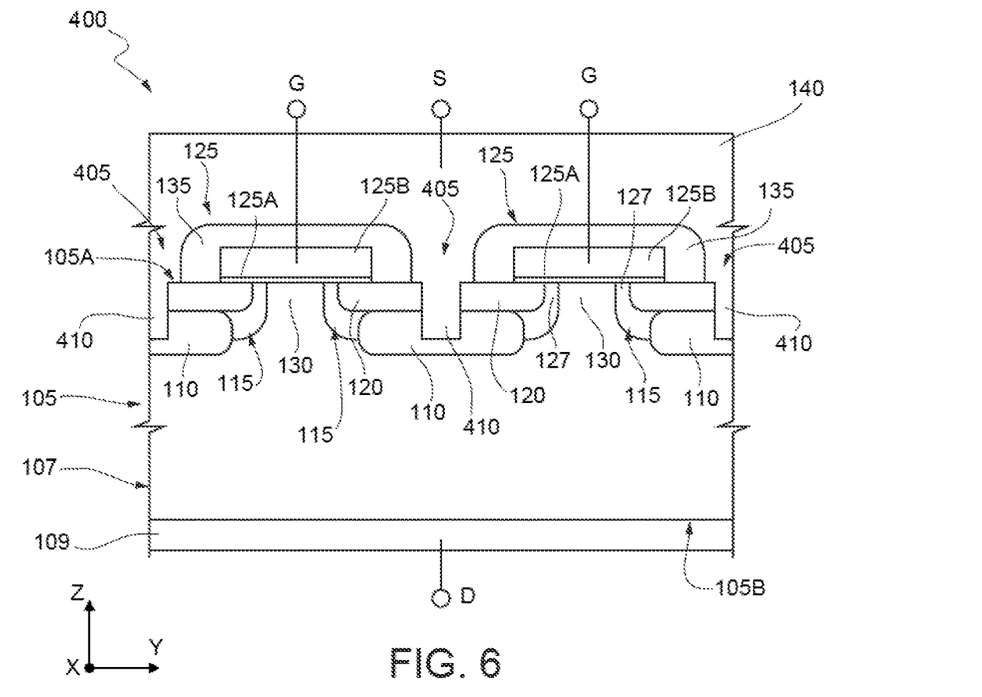
FIG. 6 shows a cross-section of the present silicon carbide vertical conduction MOSFET device, according to a different embodiment.

FIG. 6 shows a different embodiment of the present MOSFET device, here indicated by 400. The MOSFET device 400 has a general structure similar to the MOSFET device 100 of FIGS. 2 and 3. Accordingly, elements in common are indicated by the same reference numerals and are not further described.

In detail, the MOSFET device 400 is formed in the body 105 and comprises the drain region 107, the deep body regions 110, the superficial body regions 115, the source regions 120, the insulated gate regions 125, the front metallization region 140 and the drain contact region 109. Also in this embodiment, the insulated gate regions 125 extend, along the first axis X, each strip-shaped, and extend at a distance, along the second axis Y, to form elongated openings, here indicated by 405.

The MOSFET device 400 further comprises a plurality of conductive regions 410, formed by the front metallization region 140. The conductive regions 410 extend towards the inside of the body 105, at the elongated openings 405, through a respective source region 120, throughout the depth thereof, and partially through a respective deep body region 110.

The conductive regions 410 may extend throughout the length (along the first axis X) of the MOSFET device 400, in a not-shown manner. In this embodiment, therefore, the body contact regions 145 are not present.

Therefore, in the MOSFET device 400, the front metallization region 140 is in ohmic contact both with the source regions 120 and with the deep body regions 110. Accordingly, the contact resistance between the source regions 120 and the deep body regions 110 is low. It follows that the MOSFET device 400 allows, in use, an unwanted voltage drop between the source regions 120 and the deep body regions 110 to be avoided, thus improving the electrical performance of the MOSFET device 400.

Figure 7:
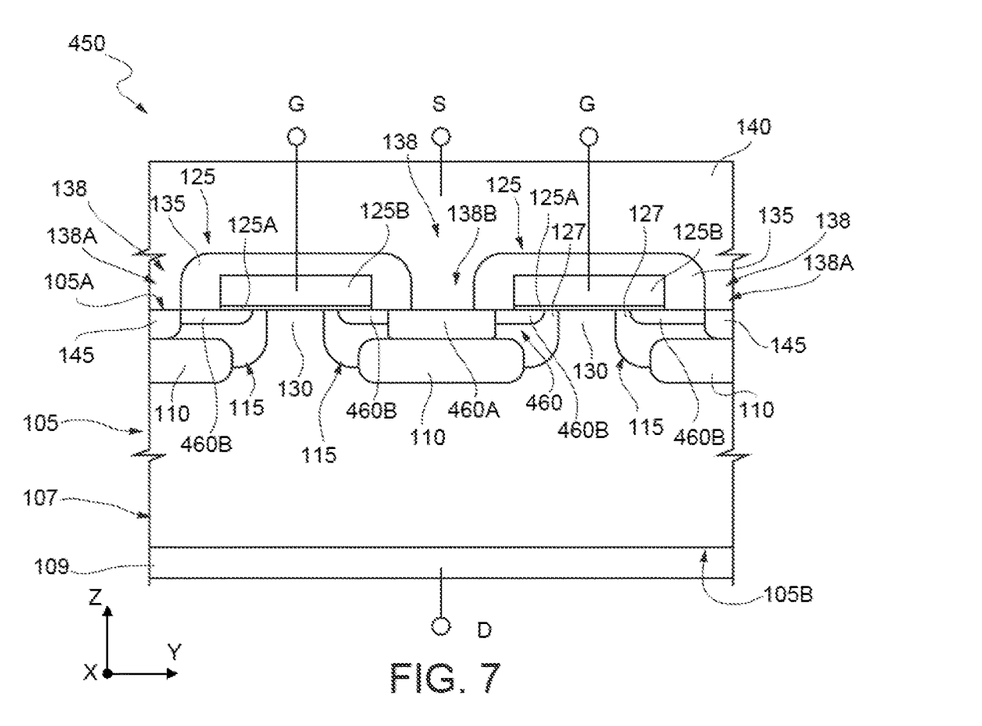
FIG. 7 shows a cross-section of the present silicon carbide vertical conduction MOSFET device, according to a different embodiment.

FIG. 7 shows a different embodiment of the present MOSFET device, here indicated by 450. The MOSFET device 450 has a general structure similar to the MOSFET device 100 of FIGS. 2 and 3. Accordingly, elements in common are indicated by the same reference numerals and are not further described.

In detail, the MOSFET device 450 is formed in the body 105 and comprises the drain region 107, the deep body regions 110, the superficial body regions 115, the insulated gate regions 125, the body contact regions 145, the front metallization region 140 and the drain contact region 109. As discussed for the MOSFET device 100 of FIG. 2, the insulated gate regions 125 form also here the elongated openings 138, which comprise the first and the second contact zones 138A, 138B. The body contact regions 145 extend into the body 105, at the first contact zones 138A.

In this embodiment, the source regions, indicated by 460, also here of N-type, comprise a first portion 460A and a second portion 460B, wherein the first portion 460A has a doping level comprised, for example, between $1 \cdot 10^{18}$ atoms/$cm^3$ and $1 \cdot 10^{20}$ atoms/$cm^3$, and the second portion 460B has a lower doping level than the first portion 460A.

In particular, in FIG. 7, the first portions 460A of the source regions 460 each extend at a respective second contact zone 138B, from the first surface 105A of the body 105 into the body 105, inside a respective superficial body region 115, in direct electrical contact with a respective deep body region 110.

Figure 7A:
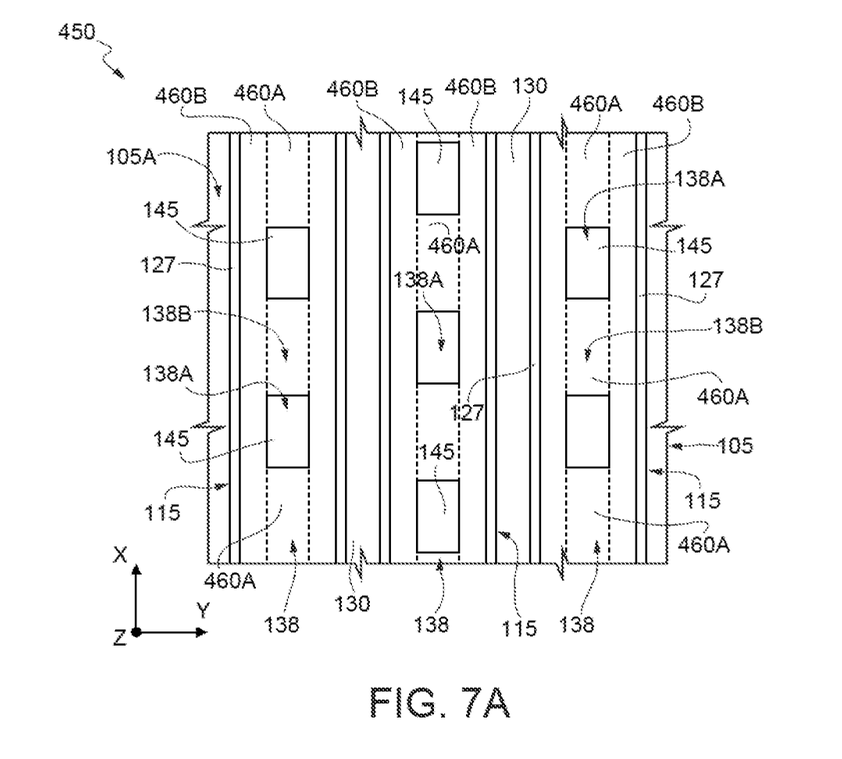
FIG. 7A shows a top plan view of the MOSFET device of FIG. 7.

As visible in FIG. 7A, wherein, for clarity, the second portions 460B of the source regions 460 are separated from the first portions 460A by a dashed line, the first portions 460A of the source regions 460 extend, along the first axis X, between two adjacent body contact regions 145.

The second portions 460B of the source regions 460 extend along the first axis X below the insulated gate regions 125, on the two sides, along the second axis Y, of each first portion 460A of the source regions 460 and of each body contact region 145.

The second portions 460B of the source regions 460 also extend from the first surface 105A of the body 105 into the body 105, inside a respective superficial body region 115, and are therefore arranged in a contiguous position with a respective first portion 460A, in direct electrical contact therewith.

In other words, here, the channel portions 127 are delimited laterally, along the second axis Y, by the second portion 460B of a respective source region 460, as well as by a respective superficial portion 130 of the drain region 107.

In this embodiment, the second portions 460B of the source regions 460 have a depth, along the third axis Z, smaller than the first portions 460A of the source regions 460.

In use, in an on-state, the conductive path of the MOSFET device 450 between the source terminal S and the drain terminal D, comprising the source regions 460, the channel portions 127 and the drain region 107, has a higher electrical resistance with respect to the conductive path of the MOSFET device 100 of FIGS. 2 and 3, in on-state. In fact, the second portions 460B of the source regions 460 have a lower doping level than the first portions 460A, and therefore have a higher electrical resistance.

This higher electrical resistance implies a lower saturation current value and therefore a lower heat generation, which, if excessive, may cause the MOSFET device to malfunction or even fail. Accordingly, the MOSFET device 450 may be integrated into an electronic apparatus usable in power applications, wherein it is desirable to obtain a long duration of the electronic apparatus, even in case of unwanted short-circuits; that is, the MOSFET device 450 has a high short-circuit withstand time (SCWT).

Furthermore, the second portions 460B of the source regions 460 are formed at a smaller depth, in the body 105, with respect to the first portions 460A. Thus, the second portions 460B may be formed through an implantation step of dopant ions having a lower implantation energy, for example comprised between 10 keV and 200 keV. This lower implantation energy causes the dopant ions that form the second portions 460B of the source regions 460, to be subject to less lateral straggling in the body 105. Therefore, it follows that the doping level of the channel portions 127, which are arranged laterally, in a contiguous position along the second axis Y, to the second portions 460B of the source regions 460, is less affected by the step of forming the second portions 460B of the source regions 460.

Figure 8:
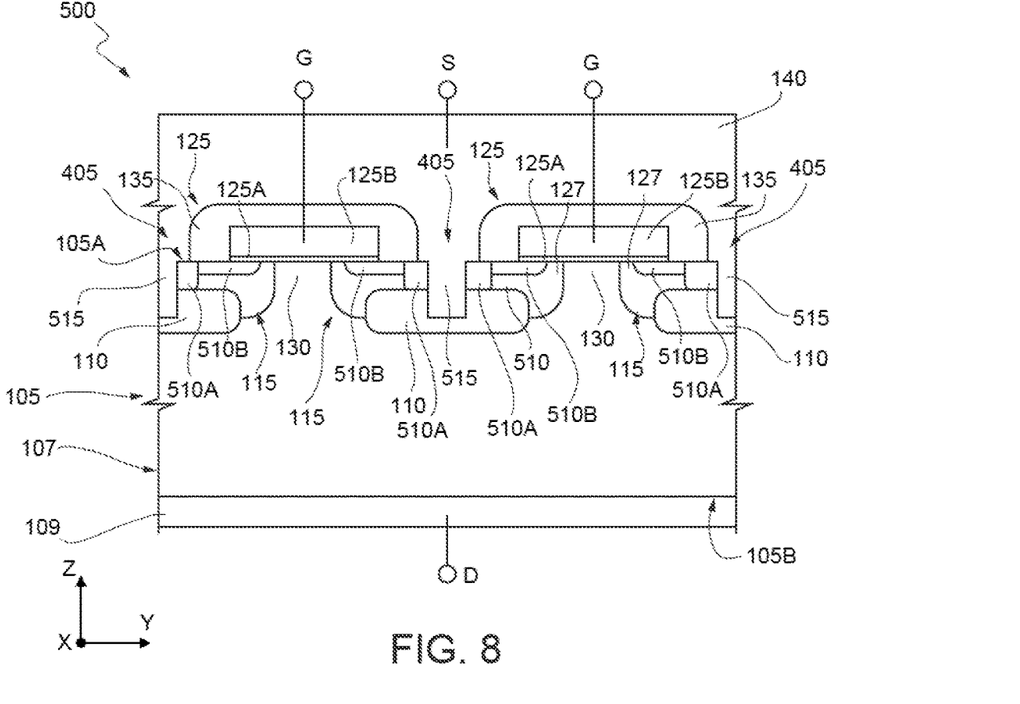
FIG. 8 shows a cross-section of the present silicon carbide vertical conduction MOSFET device, according to a different embodiment.

FIG. 8 shows a further embodiment of the present MOSFET device, here indicated by 500. The MOSFET device 500 has a general structure similar to the combination of the MOSFET device 400 of FIG. 6 and of the MOSFET device 450 of FIG. 7. Accordingly, elements in common are indicated by the same reference numerals and are not further described.

The MOSFET device 500 is formed in the body 105 and comprises the drain region 107, the deep body regions 110, the superficial body regions 115, the insulated gate regions 125, the front metallization region 140 and the drain contact region 109.

The insulated gate regions 125 form also here the elongated openings 405.

Also in this embodiment, the source regions, indicated by 510, comprise a first portion 510A and a second portion 510B, wherein the second portion 510B has a lower doping level than the first portion 510A.

Furthermore, the front metallization region 140 has a plurality of conductive portions 515, similar to the conductive portions 410 of the MOSFET device 400 of FIG. 6. The conductive portions 515 extend at the elongated openings 405 towards the inside of the body 105, through the first portion 510A of a respective source region 510 and partially through a respective deep body region 110.

Here again, the body contact regions 145 are not present.

The second portions 510B of the source regions 510 thus extend along the first axis X below the insulated gate regions 125, on the two sides of the first portions 510A of the source regions 510, in direct electrical contact therewith. Therefore, also here, the second portions 510B of the source regions 510 each delimit, on one side, a respective channel portion 127.

It follows that, in use, the MOSFET device 500 has, with respect to the MOSFET device 100 of FIGS. 2-3, both a high short-circuit withstand time, as discussed hereinabove with reference to the MOSFET device 450 of FIG. 7, and a low contact resistance between the front metallization region 140 and the deep body regions 110, as discussed hereinabove with reference to the MOSFET device 400 of FIG. 6.

Figure 9:
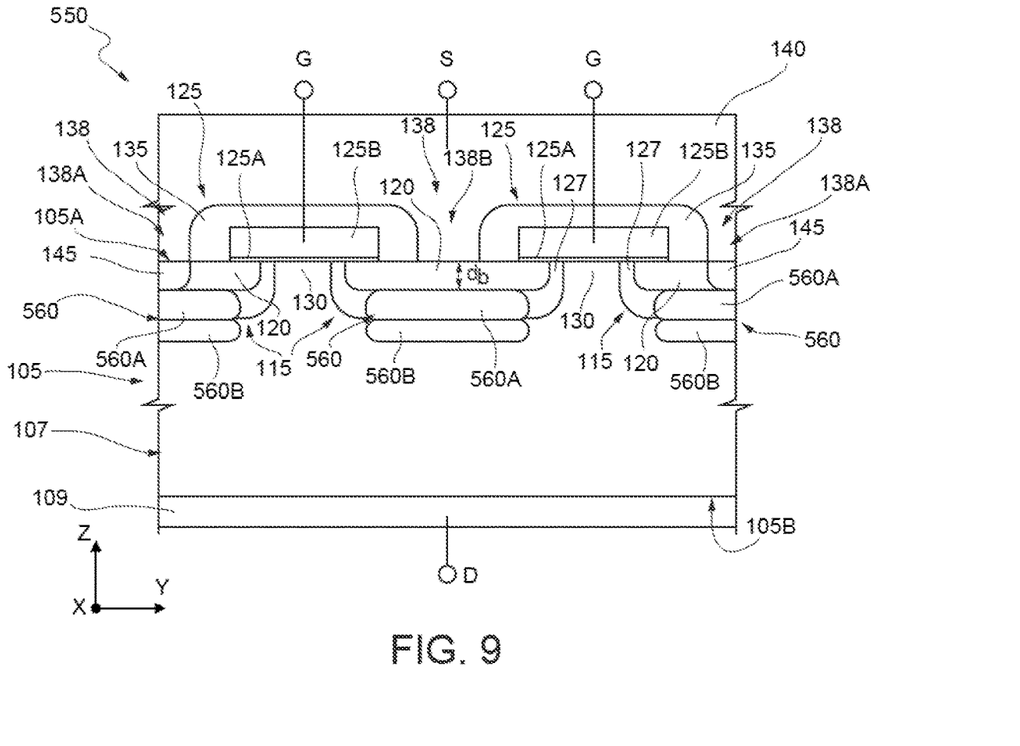
FIG. 9 shows a cross-section of the present silicon carbide vertical conduction MOSFET device, according to a different embodiment.

FIG. 9 shows a different embodiment of the present MOSFET device, here indicated by 550. The MOSFET device 550 has a general structure similar to the MOSFET device 100 of FIGS. 2 and 3. Accordingly, elements in common are indicated by the same reference numerals and are not further described.

In detail, the MOSFET device 550 is formed in the body 105 and comprises the drain region 107, the superficial body regions 115, the source regions 120, the insulated gate regions 125, the body contact regions 145, the front metallization region 140 and the drain contact region 109.

In this embodiment, the deep body regions, indicated by 560, each comprise a first portion 560A and a second portion 560B.

The first portions 560A each extend into the body 105 directly below the source regions 120, from the body depth $d_b$. The first portions 560A have a doping level comprised for example between $1 \cdot 10^{18}$ atoms/cm$^3$ and $1 \cdot 10^{19}$ atoms/cm$^3$.

The second portions 560B each extend at the bottom of, and in a contiguous position with, a respective first portion 560A, i.e., at a greater depth along the third axis Z. The second portions 560B have a lower doping level with respect to the first portions 560A, for example comprised between $1 \cdot 10^{17}$ atoms/cm$^3$ and $1 \cdot 10^{18}$ atoms/cm$^3$.

In use, in an off-state, the MOSFET device 550 is capable of withstanding a high voltage $V_{DS}$ between the source terminal S and the drain terminal D. In fact, since the second portions 560B of the deep body regions 560 have a lower doping level with respect to the first portions 560A of the deep body regions 560, the voltage $V_DS$ forms a depleted region that extends both inside the second portions 560B and inside the drain region 107. Accordingly, each N+/P+/P/N structure, which is formed by a respective source region 120, by the first and the second portions 560A, 560B of a respective deep body region 560 and by the drain region 107, respectively, has a higher breakdown voltage with respect to the MOSFET device 100 of FIGS. 2 and 3.

It will be clear to the person skilled in the art that the MOSFET devices 400, 450, 500 and 550 may be manufactured in a manner similar to what has already been discussed for the MOSFET device 100, with reference to FIGS. 4A-4D and/or 5A-5C, and therefore not further described herein.

Finally, it is clear that modifications and variations may be made to the MOSFET devices 100, 400, 450, 500 and 550 and to the manufacturing processes thereof described and illustrated herein, without thereby departing from the protective scope of the present disclosure, as defined in the attached claims.

For example, the different described embodiments may be combined to provide further solutions.

Furthermore, the types of conductivity of the drain region 107, the source regions 120, 460, 510, the deep body regions 110, 560 and the superficial body regions 115 may be inverted.

For example, in the manufacturing processes described with reference to FIGS. 4A-4D and 5A-5C, the annealing step may be performed only once, after the implantations of dopant ions that lead to the formation of the deep body regions, the superficial body regions and the source regions. This allows the manufacturing costs of the corresponding MOSFET device to be reduced and a correct activation of the dopant ions and reduction of defects of the crystal lattice caused by the implantations to be ensured.

A vertical conduction MOSFET device (100; 400; 450; 500; 550) may be summarized as including a body (105) of silicon carbide having a first type of conductivity and a face (105A); a superficial body region (115) of a second type of conductivity, having a first doping level, extending into the body, from the face of the body, to a first depth ($d_{sb}$) along a first direction (Z), and having a first width ($W_{sb}$) along a second direction (Y) transversal to the first direction; a source region (120) of the first type of conductivity, extending towards the inside of the superficial body region, from the face of the body, to a second depth ($d_b$), along the first direction, and having a second width ($W_s$) along the second direction, wherein the second depth is smaller than the first depth and the second width is smaller than the first width; and a deep body region (110) of the second type of conductivity, having a second doping level, extending into the body, at a distance from the face of the body, and in direct electrical contact with the superficial body region, wherein the second doping level is higher than the first doping level.

The first doping level may include between $5 \cdot 10^{16}$ atoms/cm$^3$ and $5 \cdot 10^{17}$ atoms/cm$^3$ and the second doping level may include between $1 \cdot 10^{18}$ atoms/cm$^3$ and $1 \cdot 10^{20}$ atoms/cm$^3$.

The deep body region may extend from the second depth to a third depth, the third depth being greater than the second depth.

The third depth may be greater than the first depth.

The source region (460; 510) may laterally delimit a channel portion (127) of the superficial body region (115) and may include a terminal contact portion (460A; 510A) and a channel contact portion (460B; 510B), the terminal contact portion having a third doping level and extending from the face of the body, inside the superficial body region, to the second depth along the first direction; the channel contact portion having a fourth doping level lower than the third doping level and extending from the face of the body, inside the superficial body region, in a contiguous position with and in direct electrical contact with, on a first side, the respective terminal contact portion and, on a second side, the channel portion.

The MOSFET device may further include a body contact region (145) having the second type of conductivity and extending from the face of the body, inside the source region, to the second depth along the first direction, in direct electrical contact with the deep body region, the source region laterally surrounding the body contact region.

The source region (460; 510) may laterally delimit a channel portion (127) of the superficial body region (115) and may include a channel contact portion (460B; 510B), the channel contact portion extending from the face of the body, inside the superficial body region in a contiguous position with and in direct electrical contact with, on a first side, the body contact region and, on a second side, the channel portion.

The MOSFET device may further include a metallization region extending on the face of the body and having a body contact portion (410; 515) extending inside the body (105) through the source region and partially towards the inside of the deep body region, the source region laterally surrounding the body contact portion, the body contact portion being in ohmic contact with the deep body region and with the source region.

The channel contact portion of the source region may extend into the superficial body region (115), along the first direction, to a fourth depth, which is smaller than the second depth.

The deep body region (560) may include a first portion (560A) and a second portion (560B), the first portion having the second doping level and extending into the body, at a distance from the face of the body, and the second portion having a fifth doping level lower than the second doping level, the second portion of the deep body region extending into the body (105) at a depth, along the first direction (Z), greater than the first portion of the deep body region and in direct electrical contact with the first portion of the deep body region.

The superficial body region may be a first superficial body region, the source region may be a first source region and the deep body region may be a first deep body region, further including a second superficial body region, a second source region and a second deep body region, the second superficial body region and the first superficial body region laterally delimiting a superficial portion (130) of the body (105) having a fourth width ($W_{sp}$) along the second direction (Y).

A process for manufacturing a vertical conduction MOSFET device, from a work body (218; 300) of silicon carbide having a first type of conductivity and a face (215A; 300A) may be summarized as including forming, in the work body, a superficial body region (115) of a second type of conductivity, having a first doping level, the superficial body region extending from the face of the work body, to a first depth ($d_{sb}$) along a first direction (Z), and having a first width ($W_{sb}$) along a second direction (Y) transversal to the first direction; forming a source region (120), of the first type of conductivity, in the superficial body region, the source region extending from the face of the work body, to a second depth ($d_s$), along the first direction, and having a second width ($W_s$) along the second direction, wherein the second depth is smaller than the first depth and the second width is smaller than the first width; and forming, in the work body, a deep body region (110) of the second type of conductivity, having a second doping level, at a distance from the face of the body, the deep body region being in direct electrical contact with the superficial body region (115), wherein the second doping level is higher than the first doping level.

Forming the deep body region may include, from a wafer (200) of silicon carbide having the first type of conductivity and a face (200A) implanting first dopant ions on the face of the wafer using a first mask (205); growing an epitaxial layer (215) on the face of the wafer of silicon carbide, forming the work body (218); and forming the superficial body region includes implanting second dopant ions on the face of the work body using a second mask (220).

The first dopant ions and the second dopant ions may be implanted using an implantation energy included between 30 keV and 200 keV.

Forming the deep body region may include implanting first dopant ions on the face (300A) of the work body (300) using a first mask (305) and an implantation energy included between 100 keV and 1 MeV; and forming the superficial body region includes implanting second dopant ions on the face of the work body using a second mask (220) and an implantation energy included between 30 keV and 200 keV.

The first mask and the second mask each may include a respective portion, the portion of the first mask having, along the second direction (Y), a greater width with respect to the portion of the second mask.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A vertical conduction MOSFET device, comprising:
a body of silicon carbide having a first type of conductivity and a face;
a superficial body region of a second type of conductivity, having a first doping level, extending into the body, from the face of the body, to a first depth along a first direction, and having a first width along a second direction transversal to the first direction;
a source region of the first type of conductivity, extending toward an inside of the superficial body region, from the face of the body,
wherein the source region includes an outer portion and an inner portion extending through the outer portion, the outer portion extending into the superficial body region to a second depth along the first direction and having a second width along the second direction, the inner portion extending into the superficial body region to a third depth along the first direction,
wherein the second depth is smaller than the first depth and the third depth, and the second width is smaller than the first width; and
a deep body region of the second type of conductivity, having a second doping level, and extending into the body, from the inner portion at the third depth, to a fourth depth along the first direction and past the first depth,
wherein the deep body region directly underlies the source region, is spaced from the face of the body by the source region, is in direct electrical contact with the superficial body region, and has a third width along the second direction,
wherein the second doping level is higher than the first doping level, the third width is smaller than the second width, and the fourth depth is greater than the first depth.

2. The MOSFET device according to claim 1, wherein the first doping level is between $5 \cdot 10^{16}$ atoms/cm$^3$ and $5 \cdot 10^{17}$ atoms/cm$^3$ and the second doping level is between $1 \cdot 10^{18}$ atoms/cm$^3$ and $1 \cdot 10^{20}$ atoms/cm$^3$.

3. The MOSFET device according to claim 1, further comprising:
another superficial body region of a second type of conductivity, extending into the body from the face of the body;

another source region of the first type of conductivity, extending toward an inside of the another superficial body region, from the face of the body; and a body contact region having the second type of conductivity and extending from the face of the body, inside the another source region, the another source region laterally surrounding the body contact region.

4. The MOSFET device according to claim 3, wherein the another source region laterally delimits a channel portion of the another superficial body region and comprises a channel contact portion, the channel contact portion extending from the face of the body, inside the another superficial body region in a contiguous position with and in direct electrical contact with, on a first side, the body contact region and, on a second side, the channel portion.

5. The MOSFET device according to claim 1, further comprising a metallization region extending on the face of the body and having a body contact portion extending inside the body through the source region and partially toward an inside of the deep body region, the source region laterally surrounding the body contact portion, the body contact portion being in ohmic contact with the deep body region and with the source region.

6. The MOSFET device according to claim 1, wherein the deep body region comprises a first portion and a second portion, the first portion having the second doping level and extending into the body, at a distance from the face of the body, and the second portion having a fifth doping level lower than the second doping level, the second portion of the deep body region extending into the body at a depth, along the first direction, greater than the first portion of the deep body region and in direct electrical contact with the first portion of the deep body region.

7. The MOSFET device according to claim 1, wherein the superficial body region is a first superficial body region, the source region is a first source region and the deep body region is a first deep body region, further comprising a second superficial body region, a second source region and a second deep body region, the second superficial body region and the first superficial body region laterally delimiting a superficial portion of the body having a fourth width along the second direction.

8. The MOSFET device according to claim 1, wherein the outer portion is spaced from the deep body region by a portion of the superficial body region.

9. The MOSFET device according to claim 1, wherein the outer portion has a lower doping level than the inner portion.

10. The MOSFET device according to claim 1, further comprising:
a metallization layer on the face of the body, a portion of the metallization layer extending through the inner portion and into the deep body region.

11. The MOSFET device according to claim 1, wherein the deep body region includes a first portion, and a second portion directly underlying the first portion and having a lower doping level than the first portion.

12. A process for manufacturing a vertical conduction MOSFET device, comprising:
forming, in a silicon carbide work body having a first type of conductivity and a face, a superficial body region of a second type of conductivity, having a first doping level, the superficial body region extending from the face of the work body, to a first depth along a first direction, and having a first width along a second direction transversal to the first direction;
forming a source region, of the first type of conductivity, in the superficial body region, the source region including an outer portion and an inner portion extending through the outer portion, the outer portion extending from the face of the work body, to a second depth, along the first direction, and having a second width along the second direction, the inner portion extending from the face of the work body, to a third depth, along the first direction wherein the second depth is smaller than the first depth and the third depth, and the second width is smaller than the first width; and forming, in the work body, a deep body region of the second type of conductivity, having a second doping level, and extending into the work body, from the inner portion at the third depth, to a fourth depth along the first direction and past the first depth,
wherein the deep body region directly underlies the source region, is spaced from the face of the work body by the source region, has a third width along the second direction, and is in direct electrical contact with the superficial body region,
wherein the second doping level is higher than the first doping level, the third width is smaller than the second width, and the fourth depth is greater than the first depth.

13. The process according to claim 12, wherein forming the deep body region comprises:
implanting first dopant ions on a face of a silicon carbide wafer using a first mask, the silicon carbide wafer having the first type of conductivity; and
growing an epitaxial layer on the face of the silicon carbide wafer, forming the work body,
wherein forming the superficial body region comprises implanting second dopant ions on the face of the work body using a second mask.

14. The process according to claim 13, wherein the first dopant ions and the second dopant ions are implanted using an implantation energy between 30 keV and 200 keV.

15. The process according to claim 12, wherein forming the deep body region comprises implanting first dopant ions on the face of the work body using a first mask and an implantation energy between 100 keV and 1 MeV; and forming the superficial body region comprises implanting second dopant ions on the face of the work body using a second mask and an implantation energy between 30 keV and 200 keV.

16. The process according to claim 15, wherein the first mask and the second mask each comprise a respective portion, the portion of the first mask having, along the second direction, a greater width with respect to the portion of the second mask.

17. A device, comprising:
a silicon carbide substrate having a first conductivity type and a first surface;
a superficial body region of a second conductivity type, the superficial body region having a first doping level and extending into the substrate from the first surface to a first depth along a first direction, the superficial body region having a first width along a second direction transverse to the first direction;
a source region of the first conductivity type extending into the superficial body region from the first surface, the source region including an outer portion and an inner portion extending through the outer portion, the outer portion extending into the superficial body region from the first surface to a second depth along the first direction, the inner portion extending into the superficial body region from the first surface to a third depth along the first direction, the outer portion having a second width along the second direction, wherein the second depth is less than the first depth and the third depth, and the second width is less than the first width; and a deep body region of the second conductivity type and having a second doping level that is greater than the first doping level, the deep body region spaced apart from the first surface by the inner portion and in direct contact with the superficial body region, the deep body region extending into the superficial body region, from the inner portion at the third depth, to a fourth depth along the first direction and past the first depth, wherein the fourth depth is greater than the first depth, the deep body region having a third width along the second direction, wherein the third width is less than the second width.

18. The device according to claim 17, wherein the first doping level is between $5 \cdot 10^{16}$ atoms/cm$^3$ and $5 \cdot 10^{17}$ atoms/cm$^3$ and the second doping level is between $1 \cdot 10^{18}$ atoms/cm$^3$ and $1 \cdot 10^{20}$ atoms/cm$^3$.

19. The device according to claim 17, wherein the superficial body region at least partially surrounds the source region and the deep body region.

20. The device according to claim 17, further comprising a metallization region on the first surface and having a body contact portion extending into the substrate through the source region and at least partially into the deep body region, the source region laterally surrounding the body contact portion, the body contact portion being in ohmic contact with the deep body region and with the source region.

* * * * *